(12) United States Patent
Teo et al.

(10) Patent No.: US 10,276,704 B1
(45) Date of Patent: Apr. 30, 2019

(54) HIGH ELECTRON MOBILITY TRANSISTOR WITH NEGATIVE CAPACITOR GATE

(71) Applicant: Mitsubishi Electric Research Laboratories, Inc., Cambridge, MA (US)

(72) Inventors: Koon Hoo Teo, Lexington, MA (US); Nadim Chowdhury, Cambridge, MA (US)

(73) Assignee: Mitsubishi Electric Research Laboratiories, Inc., Cambridge, MA (US)

( * ) Notice: Subject to any disclaimer, the term of this patent is extended or adjusted under 35 U.S.C. 154(b) by 0 days.

(21) Appl. No.: 15/785,610

(22) Filed: Oct. 17, 2017

(51) Int. Cl.
*H01L 29/778* (2006.01)
*H01L 29/51* (2006.01)
(Continued)

(52) U.S. Cl.
CPC ........ *H01L 29/778* (2013.01); *H01L 29/4958* (2013.01); *H01L 29/517* (2013.01); *H01L 29/66462* (2013.01); *H01L 29/78391* (2014.09)

(58) Field of Classification Search
CPC ......... H01L 29/66431; H01L 29/66462; H01L 29/778–29/7789; H01L 2924/13064; H01L 29/122–29/127; H01L 29/15–29/158; H01L 29/495; H01L 29/4958; H01L 29/78391
See application file for complete search history.

(56) References Cited

U.S. PATENT DOCUMENTS 7,161,194 B2  1/2007  Parikh et al.
7,692,263 B2  4/2010  Wu et al.
(Continued)

FOREIGN PATENT DOCUMENTS

JP  2012049170 A  3/2012

OTHER PUBLICATIONS

Salahuddin et al. "Can the subthreshold swing in a classical FET be lowered below 60 mV/decade?," Electron Devices Meeting, 2008. IEDM 2008. IEEE International, Dec. 15-17, 2008. Electron Devices Meeting, 2008. IEDM 2008. IEEE International.
(Continued)

*Primary Examiner* — Scott B Geyer
(74) *Attorney, Agent, or Firm* — Gennadiy Vinokur; James McAleenan; Hironori Tsukamoto

(57) ABSTRACT

A high electron mobility transistor includes a semiconductor structure having a channel layer and a cap layer forming a two dimensional electron gas (2-DEG) channel, and a source, a drain, and a gate electrodes. The gate is arranged on the cap layer between the source and the drains, such that the conductivity of the 2-DEG channel is modulated in response to applying voltage to the gate. The cap layer includes III-N material. The gate has a layered structure including a bottom metal layer arranged on cap layer, a ferroelectric oxide (FEO) layer arranged on bottom metal layer, and a top metal layer arranged on the FEO layer. Thickness of FEO layer is less than $t_{cap}/(2\alpha\varepsilon_{cap})$, wherein $\alpha$ is a parameter of material of FEO layer, $t_{cap}$ is thickness of cap layer, and $\varepsilon_{cap}$ is electric permittivity of cap layer.

20 Claims, 16 Drawing Sheets

(51) Int. Cl.
*H01L 29/66* (2006.01)
*H01L 29/78* (2006.01)
*H01L 29/49* (2006.01)

(56) References Cited

U.S. PATENT DOCUMENTS

| | | | | |
|---|---|---|---|---|
| 7,853,235 | B2 | 12/2010 | Aparin | |
| 8,362,604 | B2 | 1/2013 | Ionescu | |
| 9,396,946 | B2* | 7/2016 | Dhar | H01L 21/049 |
| 9,419,124 | B2 | 8/2016 | Parikh et al. | |
| 9,673,311 | B1 | 6/2017 | Moens et al. | |
| 9,711,616 | B2 | 7/2017 | Stewart et al. | |
| 9,755,059 | B2 | 9/2017 | Sriram | |
| 2015/0144953 | A1* | 5/2015 | Hill | H01L 29/402 257/76 |
| 2015/0214352 | A1* | 7/2015 | Strassburg | H01L 29/1608 257/77 |
| 2015/0357457 | A1* | 12/2015 | Ritenour | H01L 29/517 257/76 |
| 2016/0308021 | A1* | 10/2016 | Lee | H01L 29/1054 |
| 2016/0365435 | A1* | 12/2016 | Then | H01L 29/4236 |
| 2016/0373106 | A1* | 12/2016 | Shah | H01L 27/0207 |
| 2017/0084730 | A1* | 3/2017 | Bhalla | H01L 29/778 |

OTHER PUBLICATIONS

Chowdhurry et al. "A low subthreshold swing tunneling field effect transistor for next generation low power CMOS applications." Physica E: Low-dimensional Systems and Nanostructures vol. 74, Nov. 2015, pp. 251-257.

Chowdhury, et al., "Negative Capacitance Tunnel Field Effect Transistor: A Novel Device with Low Subthreshold Swing and High ON Current." ECS Transactions, 58 (16) 1-8 (2014), 10.1149/05816. 0001ecst © The Electrochemical Society.

Lisa Malin, "Ferroelectric Gate on AlGaN/GaN Heterostructures." Thèse No. 3821 (2007), Présentée le 4 juin 2007. À La Faculté Des Sciences Et Techniques De L'Ingénieur Laboratoire de céramique Section De Science Et Génie Des Matériaux.

Khan et al., "Negative capacitance in a ferroelectric capacitor." Nature Materials, Letters Published Online: Dec. 15, 2014 | DOI: 10.1038/NMAT4148. vol. 14, pp. 182-186.

Chen et al., "Experimental Demonstration of Ferroelectric Gate-Stack AlGan/Gan-on-Si MOS-HEMTs with Voltage Amplification for Power Applications," IEEE Transactions on Electron Devices, vol. 61, No. 8, Aug. 2014. pp. 3014-3017.

Chatterjee et al., "Analysis of AlGan/GaN high Electron Mobility Transistor for High Frequency Application," 2017 Devices for Integrated Circuit, IEEE, Mar. 23, 2017. pp. 196-199.

* cited by examiner

HIGH ELECTRON MOBILITY TRANSISTOR WITH NEGATIVE CAPACITOR GATE

TECHNICAL FIELD

The present invention relates generally to semiconductor device, and more particularly to high electron mobility transistor suitable for high-power and high frequency applications.

BACKGROUND

With the recent upsurge of the wireless communication market, microwave transistors are playing critical roles in many aspects of human activities.

The requirements for the performance of microwave transistors are becoming more and more demanding. In the personal mobile communication applications, next generation cell phones require wider bandwidth and improved efficiency. The development of satellite communications and TV broadcasting requires amplifiers operating at higher frequencies (from C band to Ku band, further to Ka band) and higher power to reduce the antenna size of terminal users. The same requirement holds for broadband wireless internet connections as well because of the ever increasing speed or data transmission rate.

Because of these needs, there has been significant investment in the development of high performance microwave transistors and amplifiers based on Si/SiGe, GaAs, SiC and GaN. The Johnson Figure of Merit (JM) gives the power-frequency limit based solely on material properties and can be used to compare different materials for high frequency and high power applications. The requirement for high power and high frequency requires transistors based on semiconductor materials with both large breakdown voltage and high electron velocity. From this point of view, wide bandgap materials, like GaN and SiC, with higher JM are preferable. The wide bandgap results in higher breakdown voltages because the ultimate breakdown field is the field required for band-to-band impact ionization. Moreover, both have high electron saturation velocities, which allow high frequency operation.

The ability of GaN to form heterojunctions makes it superior compared to SiC, in spite of having similar breakdown fields and saturation electron velocities. GaN can be used to fabricate high electron mobility transistors (HEMTs) whereas SiC can only be used to fabricate metal semiconductor field effect transistors (MESFETs). The advantages of the HEMT include its high carrier concentration and its higher electron mobility due to reduced ionized impurity scattering. The combination of high carrier concentration and high electron mobility results in a high current density and a low channel resistance, which are especially important for high frequency operation and power switching applications.

From the amplifier point of view, GaN-based HEMTs have many advantages over existing production technologies. The high output power density allows the fabrication of much smaller size devices with the same output power. Higher impedance due to the smaller size allows for easier and lower loss matching in amplifiers. The operation at high voltage due to its high breakdown electric field not only reduces the need for voltage conversion, but also provides the potential to obtain high efficiency, which is a critical parameter for amplifiers. The wide bandgap also enables it to operate at high temperatures. At the same time, the HEMT offers better noise performance than that of MESFET's. These attractive features in amplifier applications enabled by the superior semiconductor properties make the GaN-based HEMT a very promising candidate for different power applications.

A lot of research has been conducted to improve linearity and normally on or off behavior of the HEMT. See, e.g., U.S. 20080283870. However, there is also a need to further increase the output power of HEMTs.

SUMMARY

A nitride semiconductor device is used for high-power and high-frequency applications, due to its combination of fundamental physical properties, such as large band gaps, large breakdown fields, and high electron mobility. One way to achieve the gain and efficiency requirements at Ka-band and above is to reduce transit time for carriers in the channel region by reducing the gate length. In order to achieve high power, high frequency and low on resistance suitable for high-power applications, it is desirable to increase the carrier density at the channel formed by the semiconductor device.

Some embodiments are based on recognition that the maximum power that can be taken out from a HEMT depends on two dimensional electron gas (2-DEG) carrier density, the higher the 2-DEG density the higher the output power. On the other hand, the 2-DEG density depends on the thickness of the cap layer, i.e. one of the layer of semiconductor material forming the heterojunction in the HEMT. Specifically, a higher cap layer thickness yields higher power and vice versa. However, thicker cap layer reduces the gate capacitance thus the cut off frequencies. Therefore, there is a need for developing a method to increase the cap layer thickness without reducing the gate capacitance.

Some embodiments are based on realization that if the gate of the HEMT includes and/or acts as a negative capacitor when an electrical pulse is applied to the gate, the negative capacitance can compensate the decrement of the capacitance between the gate and the 2-DEG channel caused by the increase in the thickness of the cap layer. In such a manner, the negative capacitor of the gate allows increasing the thickness of the cap layer beyond a maximum thickness allowed for a target cut-off frequency without consideration for the negative capacitor.

Some embodiments are based on recognition that the negative capacitor is unstable in isolation, but can be stabilized if connected in series with a positive capacitor. Further, after some experiments, some embodiments are based on realization that III-N material can be used for both forming a positive capacitor with the metal of the gate and to form heterojunction with another semiconducting material to form the 2-DEG channel Examples of III-N material include one or combination of aluminum gallium nitride (AlGaN), indium gallium nitride (InGaN), aluminum nitride (AlN), gallium nitride (GaN), indium aluminum nitride (InAlN), indium aluminum gallium nitride (InAlGaN).

For example, the negative capacitor can be realized with the help of ferroelectric oxide (FEO) material. Examples of the FEO material include one or a combination of Barium titanate ($BaTiO_3$), Strontium titanate (SrTiO3), Hafnium Zirconium Oxide (HfZrOx) and Doped Hafnium oxide. When a layer of FEO material is sandwiched between two layers of metal and combined with the cap layer that includes III-N material, such a layered structure forms the series of positive and negative capacitors when the thickness of the FEO layer is less than $t_{cap}/(2\alpha\varepsilon_{cap})$, wherein $\alpha$ is a parameter of the material of the FEO layer, $t_{cap}$ is the thickness of the cap layer, and $\varepsilon_{cap}$ is the electric permittivity of the cap layer. Parameter α is a constant for given FEO layer, and can be found by performing a polarization measurement as a function of applied voltage.

Accordingly, one embodiment discloses a high electron mobility transistor (HEMT), including a semiconductor structure including a channel layer and a cap layer arranged on the channel layer to form a two dimensional electron gas (2-DEG) channel at an interface of the channel layer and the cap layer, wherein the cap layer includes III-N material; a set of electrodes including a source and a drain arranged on the cap layer with electrical connection to the 2-DEG channel; and a gate arranged on the cap layer between the source and the drains, such that the conductivity of the 2-DEG channel can be modulated in response to applying voltage to the gate.

The gate has a layered structure including a bottom metal layer arranged on top of the cap layer, a FEO layer arranged on top of the bottom metal layer, and a top metal layer arranged on top of the FEO layer. The thickness of the FEO layer is less than $t_{cap}/(2\alpha\varepsilon_{cap})$, wherein α is a parameter of material of the FEO layer, $t_{cap}$ is the thickness of the cap layer, and $\varepsilon_{cap}$ is the electric permittivity of the cap layer.

In such a manner, the cap layer plays dual role in forming the 2-DEG channel and in stabilizing negative capacitor, which allows some embodiments to have the thickness of the cap layer of the semiconductor structure greater than a maximum thickness allowed for the cut-off frequency of the HEMT without consideration for the negative capacitor.

For example, in some implementations, the thickness of the cap layer is greater than a ratio of a structure dependent constant to the cut-off frequency of the HEMT minus the length of the HEMT. The value of the structure dependent constant varies for different semiconductor materials of the HEMT. The structure dependent constant can be calculated by fabricating HEMTs with varying channel length and cap layer thickness and measuring the cut off frequency. Once the fabrication and measurement is done, then the constant can be calculated by simply fitting the obtained data. For example, the structure dependent constant is 3.9 GHz-μm for the cap layer including aluminum gallium nitride (AlGaN) material.

In some embodiments, the HEMT is adapted for radio-frequency (RF) applications. To that end, in some embodiments, the mutual geometrical arrangement of the source, the drain, and the gate is selected for amplifying RF signals. For example, in one implementation, a distance between the source and the gate of the HEMT is greater than a distance between the gate and the drain.

For RF applications, subthreshold swing (SS) which enables sharp switching of a transistor is less important, because the sharp switching is used to reduce the power dissipated in a micro-processor, which typically is not a problem for the RF applications. However, transconductance is an important factor for the RF applications as the gain and frequency response of the RF HEMT depends on the value of this parameter. The higher value of that transconductance causes the higher value of the gain.

Some embodiments are based on recognition that for the same cap layer thickness, the HEMT employing principles of various embodiments is capable of providing higher transconductance. To that end, some embodiments select the thickness of the cap layer such that the transconductance of the HEMT is greater than the transconductance of the HEMT without the negative capacitor.

Accordingly, one embodiment discloses a high electron mobility transistor (HEMT), including a semiconductor structure which includes a channel layer and a cap layer arranged on the channel layer to form a two dimensional electron gas (2-DEG) channel at an interface of the channel layer and the cap layer, wherein the cap layer includes III-N material; a set of electrodes including a source and a drain arranged on the cap layer with electrical connection to the 2-DEG channel; and a gate arranged on the cap layer between the source and the drains, such that the conductivity of the 2-DEG channel is modulated in response to applying voltage to the gate, the gate having a layered structure including a bottom metal layer arranged on top of the cap layer, a ferroelectric oxide (FEO) layer arranged on top of the bottom metal layer, and a top metal layer arranged on top of the FEO layer, wherein the thickness of the FEO layer is less than $t_{cap}/(2\alpha\varepsilon_{cap})$, wherein α is a parameter of material of the FEO layer, $t_{cap}$ is the thickness of the cap layer, and $\varepsilon_{cap}$ is the electric permittivity of the cap layer.

Another embodiment discloses a method for manufacturing a high electron mobility transistor (HEMT), including providing a substrate and a semiconductor structure including a channel layer and a cap layer arranged on the channel layer to form a two dimensional electron gas (2-DEG) channel at an interface of the channel layer and the cap layer, wherein the cap layer includes III-N material; etching the semiconductor structure to define an active region of the HEMT; forming a set of electrodes including a source and a drain arranged on the cap layer with electrical connection to the 2-DEG channel by metal deposition and annealing; and forming a gate by depositing a bottom metal layer on the cap layer between the source and the drain, depositing a Ferroelectric Oxide (FEO) layer on the bottom metal layer, and depositing a top metal layer on the FEO layer, wherein the thickness of the FEO layer is less than $t_{rap}/(2\alpha\varepsilon_{cap})$, wherein α is a parameter of material of the FEO layer, $t_{cap}$ is the thickness of the cap layer, and $\varepsilon_{cap}$ is the electric permittivity of the cap layer.

DETAILED DESCRIPTION

Figure 1A:
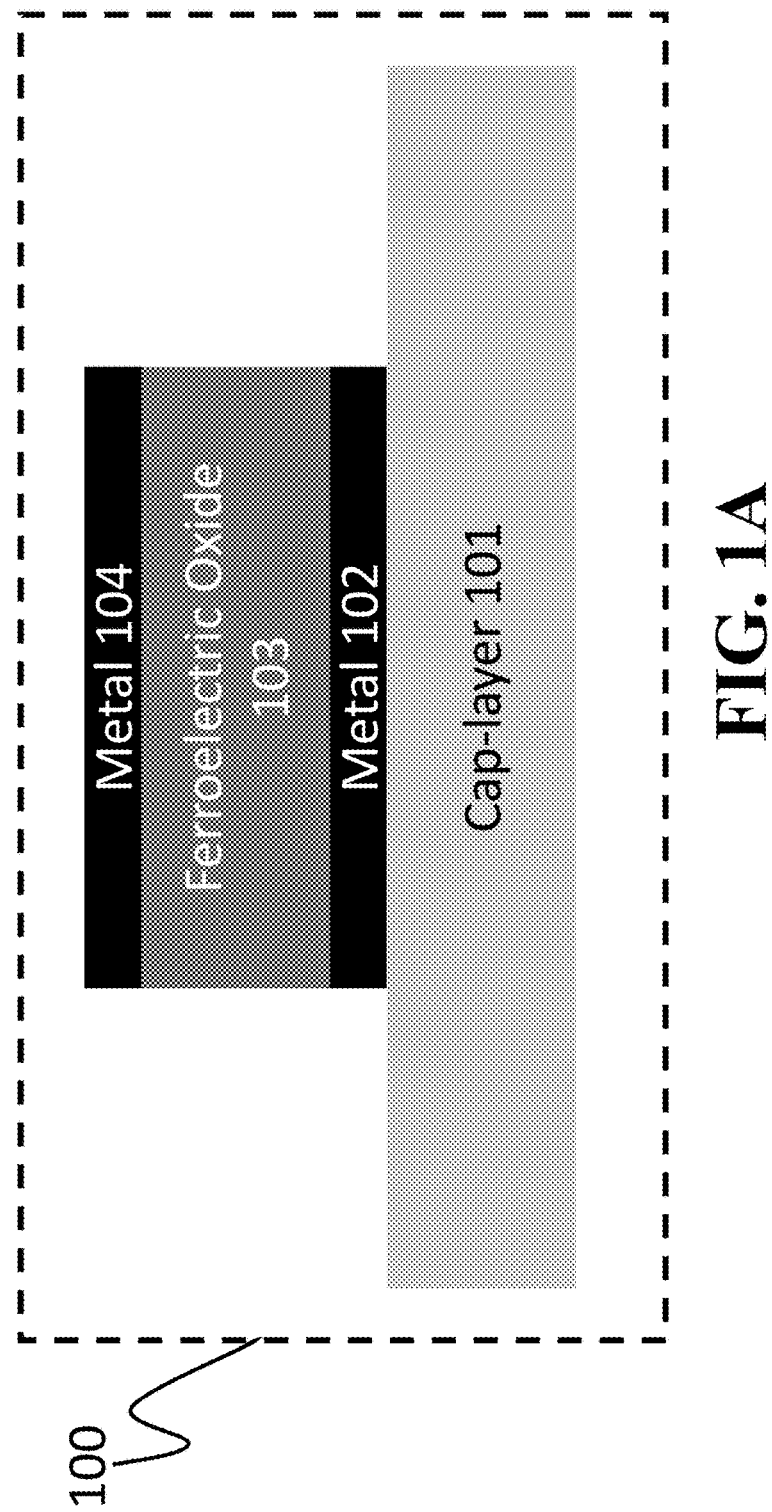
FIG. 1A shows the 2-D cross section schematic of a composite layer structure according to some embodiments.

FIG. 1 shows the 2-D cross section schematic of a composite layer structure 100 according to some embodiments. The layered structure 100 includes a nitride semiconductor based cap layer 101, a bottom metal layer 102 on top of the cap layer, a ferroelectric oxide (FEO) layer 103 on top of the metal layer 102 and a top metal layer 104 on top of the FEO layer. The thickness of the FEO layer 103 is below a critical thickness given by the following expression, $t_{rap}/(2\alpha\varepsilon_{cap})$, wherein $\alpha$ is a material based parameter for FEO which can have different values for different FEO, $t_{rap}$ is the thickness of the cap layer, and $\varepsilon_{cap}$ is the electric permittivity of the cap layer. Parameter $\alpha$ is a constant for given FEO layer, and can be found by performing a polarization measurement as a function of applied voltage.

Figure 1B:
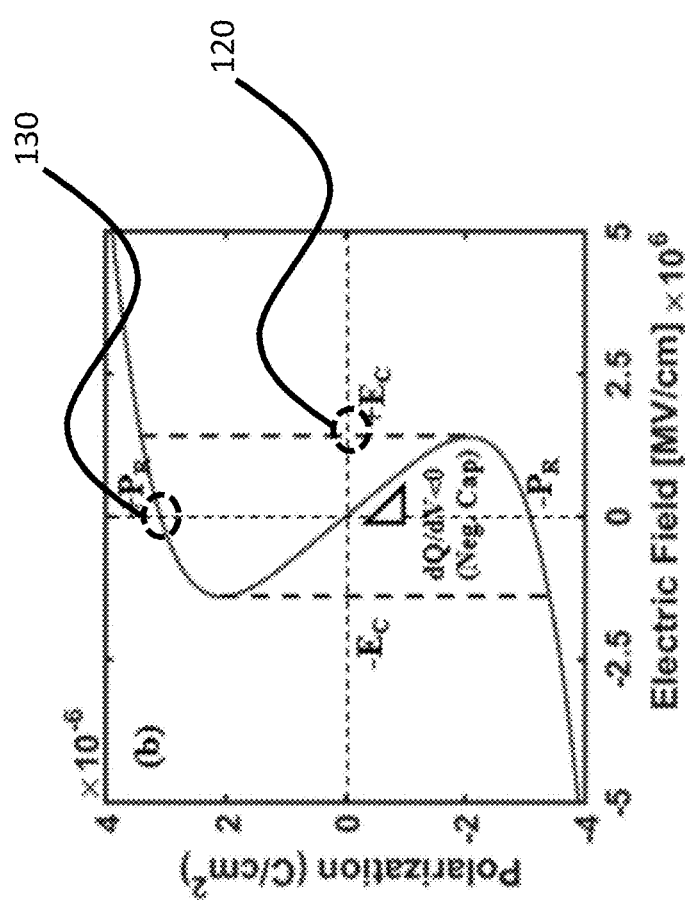
FIG. 1B shows the Polarization vs Electric field curve for an exemplar ferroelectric oxide, i.e., Hafnium Zirconium Oxide (HfZrOx).

FIG. 1B shows the Polarization vs Electric field curve for an exemplar ferroelectric oxide, i.e., Hafnium Zirconium Oxide (HfZrOx), used by some embodiments to determine parameter $\alpha$. The electric labeled in this figure as 120 is known as coercive electric field ($\varepsilon_c$) and the polarization at zero electric field labeled by 130 is known as remnant polarization $P_R$. Once PR and EC are known from the P-E measurement, the parameter $\alpha$ can be calculated by using the following equation, $$\alpha = -\frac{\sqrt{3}}{4} \times \frac{E_c}{P_R}.$$

Referring back to FIG. 1A, in the composite layer structure 100, the FEO layered sandwiched between the two metals form a negative capacitor and by keeping its thickness below the said critical thickness guarantees a stable negative capacitance operation in combination with a nitride semiconductor based cap layer 101. In addition, the nitride semiconductor based cap layer 101 can be joined with another semiconductor material to form heterojunction creating two dimensional electron gas (2-DEG) channel In such a manner, the cap layer 101 plays dual role in forming the 2-DEG channel and in stabilizing negative capacitor, which allows some embodiments to have the thickness of the cap layer of the semiconductor structure greater than a maximum thickness allowed for the cut-off frequency of the HEMT without consideration for the negative capacitor.

FEO materials are a subgroup of pyroelectric materials in which the spontaneous polarization can be reoriented between "equilibrium" states by applying an electric field. Such materials are able to hold a positive or a negative electric charge, even with no additional voltage applied. Ferroelectrics can also switch polarity, from positive to negative, when an external electric field is applied. These undergo a ferroelectric phase transition characterized by the development of a spontaneous (zero field) polarization, changes in the dielectric constant, and crystal structural changes. Examples of ferroelectric materials include $BaTiO_3$, $SrTiO_3$, $HfZrO_x$, Doped Hafnium oxide, $PbTiO_3$, $PbZr_{0.2}Ti_{0.8}O_3$ and $Sr_{0.8}Bi_{2.2}Ta_2O_9$, by way of example and not limitation.

Negative capacitance refers to the (usually) unstable charge-voltage relationship of a ferroelectric material that can be stabilized by combining the ferroelectric material with a capacitor in series. The layered structure 100 can be thought of two capacitors connected is series wherein the capacitor formed by the top metal, FEO, and bottom metal operates in the negative capacitance zone. According to some embodiment the cap layer includes nitride semiconductor of thickness between 2 nm to 250 nm. In some embodiments, a nitride semiconductor material may be used such as BwAlxInyGazN, for example, in which w, x, y and z each have any suitable value between zero and one (inclusive), and w+x+y+z=1. Examples of nitride semiconductor materials include GaN, AlN, AlGaN, InAlN, InAlGaN, and InGaN, by way of example and not limitation.

Figure 2A:
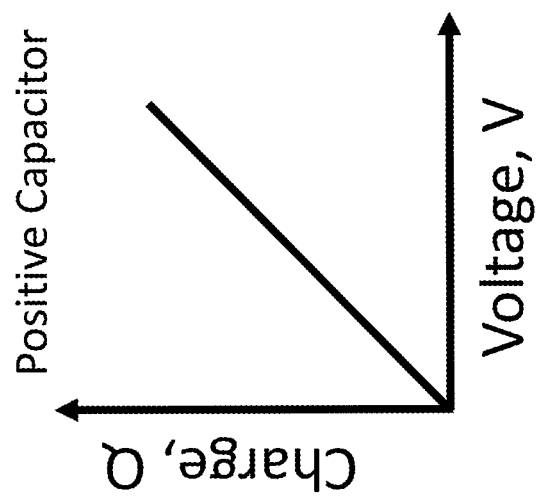
FIG. 2A shows a plot of the charge voltage characteristics of a positive capacitor formed by a cap layer according to some embodiments.

FIG. 2A shows a plot of the charge voltage characteristics of a positive capacitor formed by a cap layer 101 according to some embodiments. This plot demonstrates that the charge associated with a positive capacitor increases with the increase of the voltage across the positive capacitor.

Figure 2B:
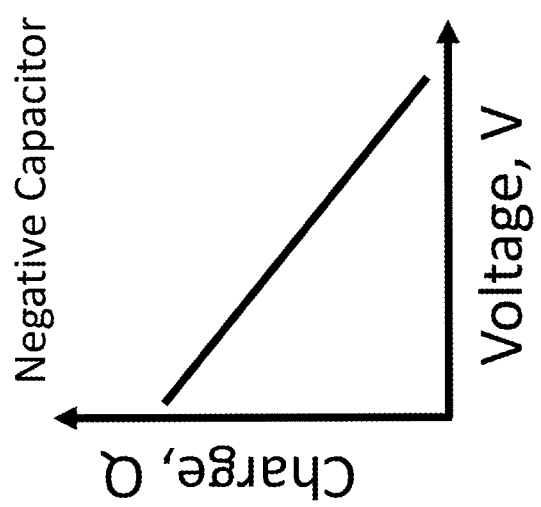
FIG. 2B shows a plot of the charge voltage characteristics of a negative capacitor formed by the FEO layer according to some embodiments.

FIG. 2B shows a plot of the charge voltage characteristics of a negative capacitor formed by the FEO layer 103 according to some embodiments. This plot demonstrates that the charge associated with a negative capacitor goes down with the increase of the voltage across the negative capacitor.

Figure 3A:
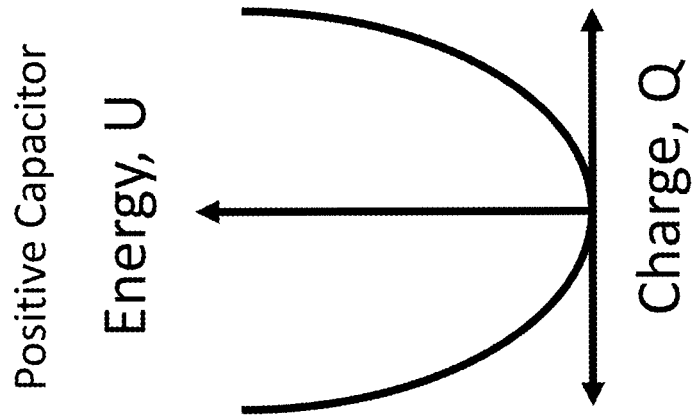
FIG. 3A shows a plot of the Energy vs Charge characteristics of a positive capacitor formed by a cap layer according to some embodiments.

FIG. 3A shows a plot of the Energy vs Charge characteristics of a positive capacitor formed by a cap layer 101 according to some embodiments. This plot has a "V" shaped Energy vs Charge curve (U vs Q). The curvature of U vs Q curve gives the value of capacitance.

Figure 3B:
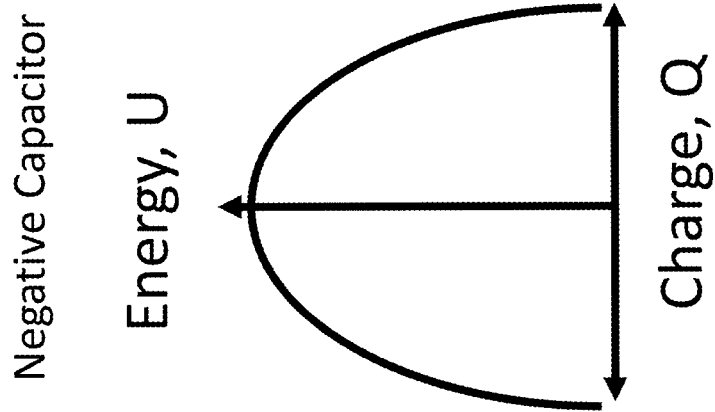
FIG. 3B shows a plot of the Energy vs Charge characteristics of a negative capacitor employed by some embodiments.

FIG. 3B shows a plot of the Energy vs Charge characteristics of a negative capacitor employed by some embodiments. This plot has an inverted/upside down "V" shaped Energy vs Charge curve (U vs Q). The curvature of U vs Q curve gives the value of capacitance. However, such a negative capacitor is unstable without additional assistance and configuration.

Figure 4:
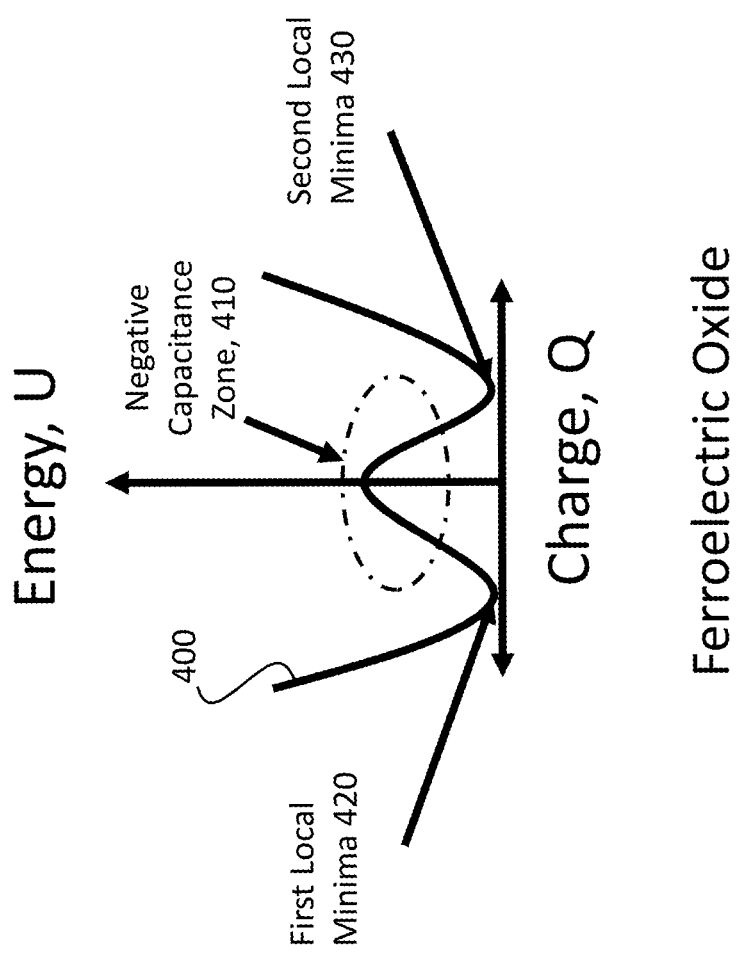
FIG. 4 shows a plot of the energy landscape curve of a ferroelectric oxide material as a function of charge used in FEO layer according to some embodiments.

FIG. 4 shows a plot of the energy landscape curve 400 of a ferroelectric oxide material as a function of charge used in FEO layer 103 according to some embodiments. The energy landscape curve of a FEO material has "W" shape 400. This curve 400 around zero charge value has negative curvature giving rise to negative capacitance, referred herein as a "negative capacitance zone". Normally a FEO material can't stay in this zone because it has higher energy and end up being either of the two local minima 420 and 430. However, adding a capacitor in series to have the same charge can make the ferroelectric oxide stable in negative capacitance zone. This is because adding a normal capacitor makes the overall energy of the system lower.

Figure 5:
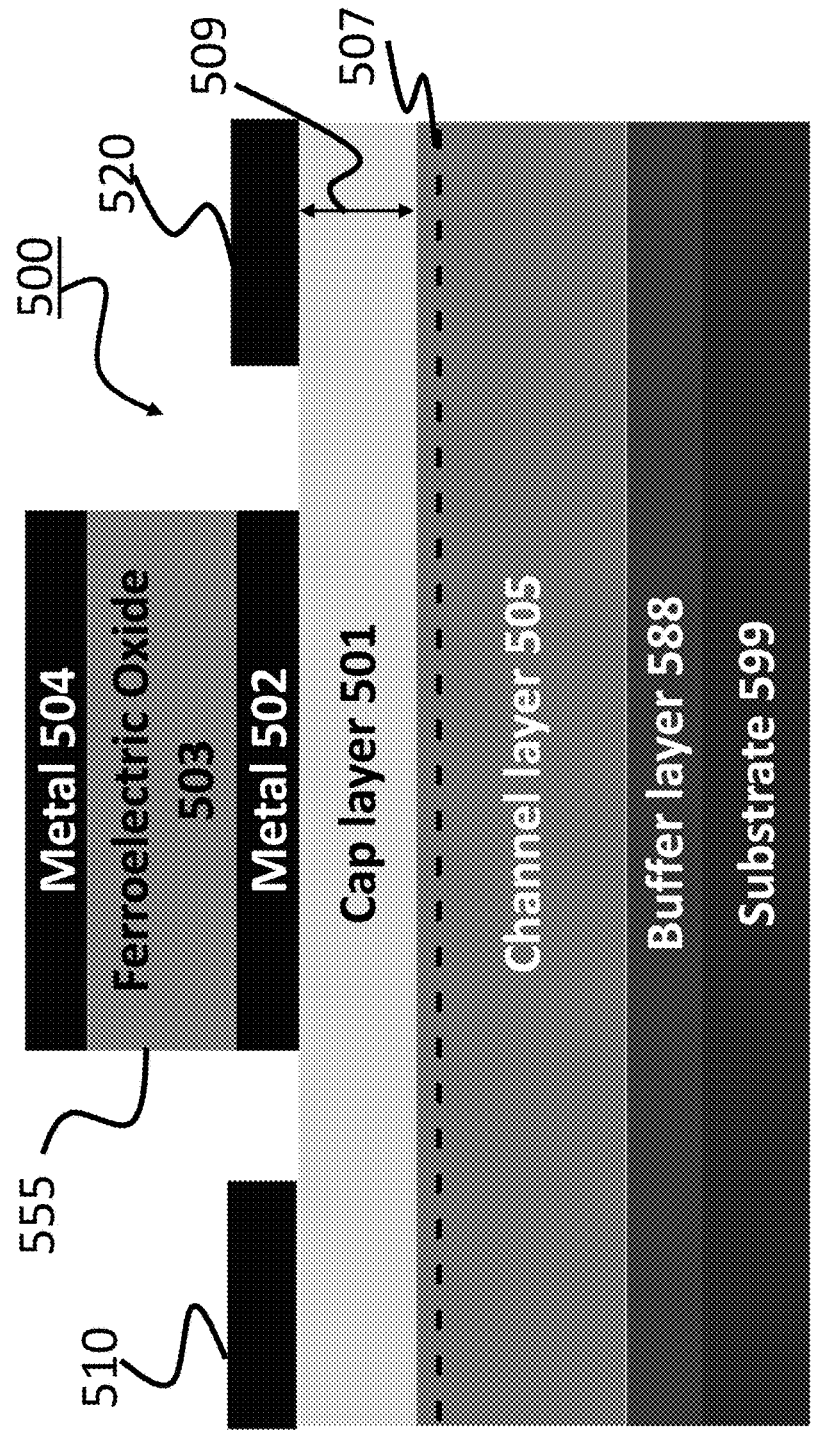
FIG. 5 shows a 2-D cross section schematic of nitride semiconductor based high electron mobility transistor (HEMT) with ferroelectric oxide as the gate dielectric according to some embodiments.

FIG. 5 shows a 2-D cross section schematic of nitride semiconductor based high electron mobility transistor (HEMT) 500 with ferroelectric oxide as the gate dielectric according to some embodiments. The HEMT 500 is also referred herein as a negative capacitance gated HEMT (NC-HEMT).

The NC-HEMT includes a gate 555 having a composite layered structure formed by a ferroelectric oxide layer 503 sandwiched between the bottom metal layer 502 and top metal layer 504 forming a metal-FEO-metal (M-FEO-M) capacitor placed on top of a cap layer 501. The cap layer includes III-N material. Beneath the 501 layer there is a channel layer 505. At the interface between the channel layer and the cap layer a two dimensional electron gas (2-DEG) labeled 507 is formed. A set of electrodes including a source 510 and a drain 520 arranged on the cap layer with electrical connection to the 2-DEG channel 507. In some implementations, the channel layer 505 is grown on a substrate 599 through the help of a buffer layer 588 to provide mechanical support for the device so that all the processing to make the device can be performed.

The thickness of the FEO layer 503 is less than $t_{cap}/(2\alpha\varepsilon_{cap})$, wherein $\alpha$ is a parameter of material of the FEO layer 503, $t_{cap}$ is the thickness of the cap layer, and $\varepsilon_{cap}$ is the electric permittivity of the cap layer. The cap layer plays dual role in forming the 2-DEG channel and in stabilizing negative capacitor, which allows some embodiments to have the thickness 509 of the cap layer of the semiconductor structure greater than a maximum thickness allowed for the cut-off frequency of the HEMT without consideration for the negative capacitor.

For example, in some implementations, the thickness of the cap layer is greater than a ratio of a structure dependent constant to the cut-off frequency of the HEMT minus the length of the HEMT. The value of the structure dependent constant varies for different semiconductor materials of the HEMT. The structure dependent constant can be calculated by fabricating HEMTs with varying channel length and cap layer thickness and measuring the cut off frequency. Once the fabrication and measurement is done, then the constant can be calculated by simply fitting the obtained data. For example, the structure dependent constant is 3.9 GHz-µm for the cap layer including aluminum gallium nitride (AlGaN) material.

Figure 6:
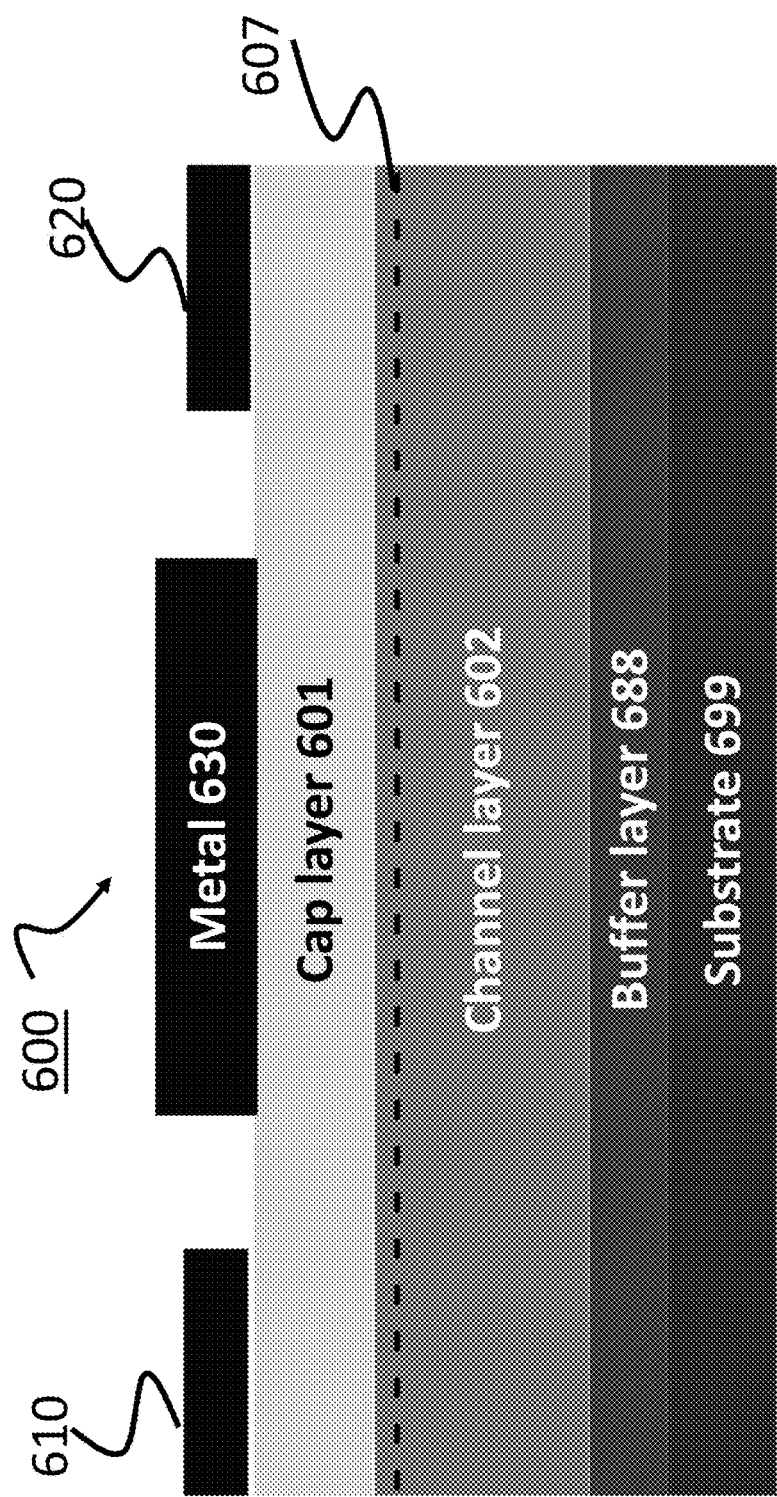
FIG. 6 shows a 2-D cross section view of a nitride semiconductor based high electron mobility transistor (HEMT) without negative capacitor.

FIG. 6 shows a 2-D cross section view of a nitride semiconductor based high electron mobility transistor (HEMT) without negative capacitor, wherein a 2-DEG labeled 607 is formed at the interface of a cap layer 601 and a channel layer 602. A source electrode 610 and drain electrode 620 are formed on top of the cap layer 601 wherein the source and the drain metal forms an Ohmic contact with the 2-DEG 607. A gate electrode 630 for modulating the conductance of the 2-DEG channel is also provided wherein the gate metal forms a Schottky contact with the cap layer.

Figure 7:
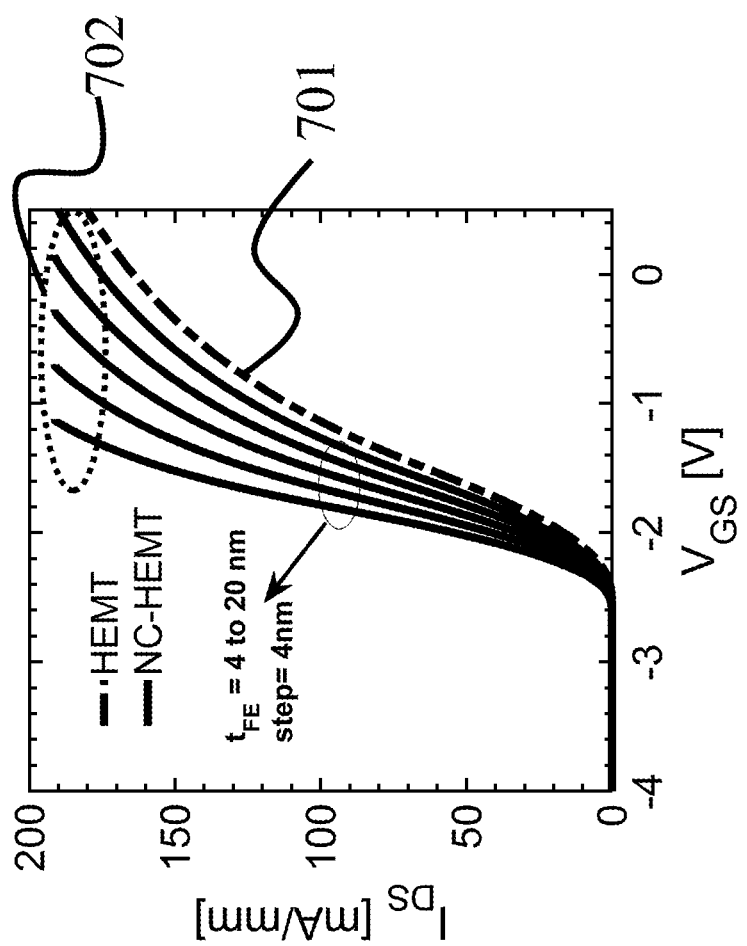
FIG. 7 shows simulated drain current vs gate voltage ($I_{DS}$ vs $V_{GS}$) characteristics of the HEMT and a negative capacitor gate HEMT (NC-HEMT) of some embodiments.

FIG. 7 shows simulated drain current vs gate voltage ($I_{DS}$ vs $V_{GS}$) characteristics of the HEMT 600 and a NC-HEMT 500. For this simulation hafnium zirconium oxide (HfZrOx) ferroelectric oxide has been used. $I_{DS}$-$V_{GS}$ characteristics for different FEO thickness ($t_{FE}$) are also presented. It is quite evident from the simulation results that for a given gate voltage ($V_{GS}$) NC-HEMT provides higher drain current labeled 702 compared to the conventional HEMT labeled 701. This result can be understood from the fact that drain current of a HEMT scales with the gate capacitance—a higher gate capacitance yielding a higher drain current and vice versa. FEO based negative capacitance of NC-HEMT amplifies the overall gate capacitance thus provides higher drain current. Another thing to be noted here is that a thicker FEO yields higher drain current for a given gate voltage.

Figure 8:
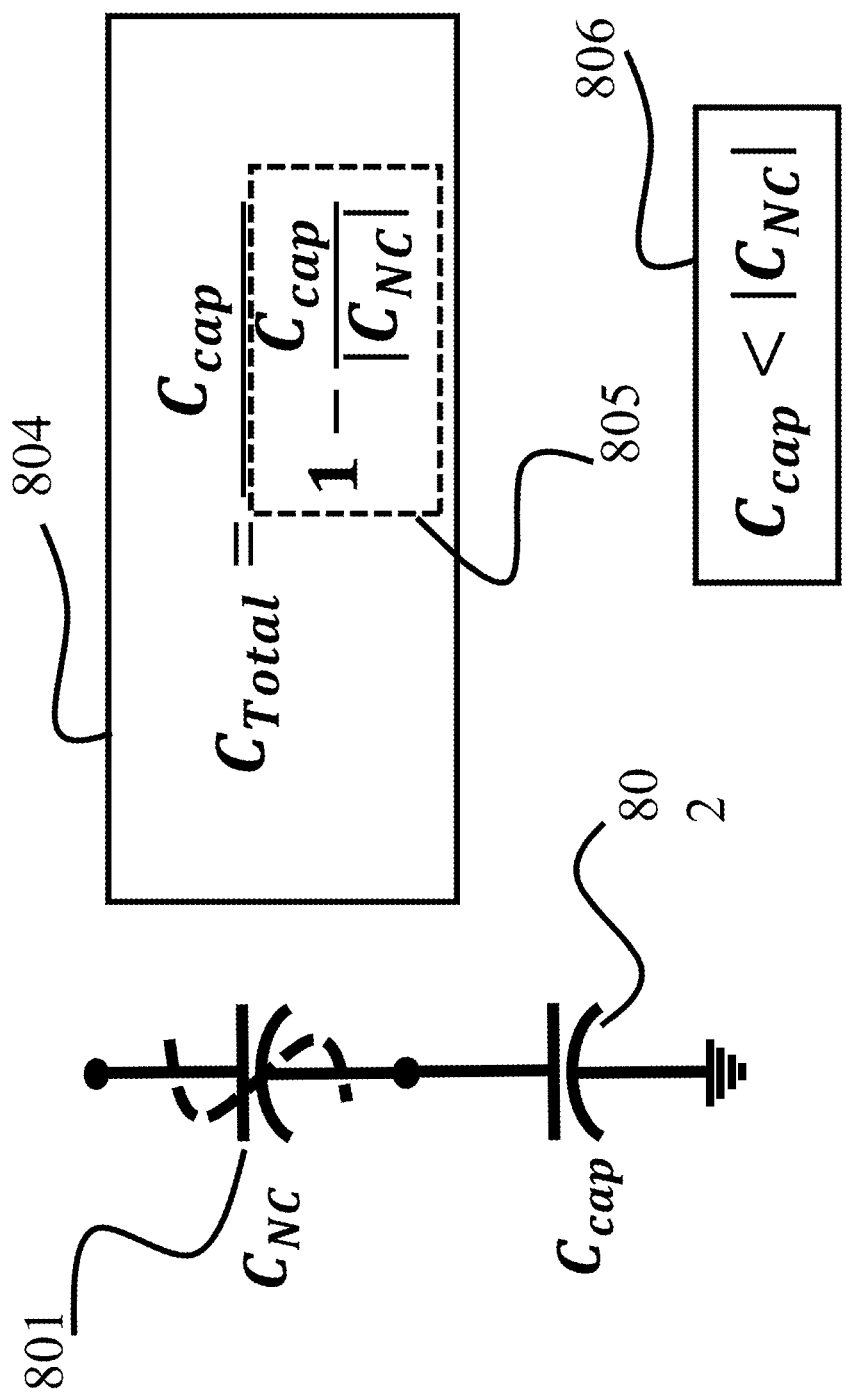
FIG. 8 shows a circuit comprising a series combination of a positive capacitor and a negative capacitor formed by some embodiments.

FIG. 8 shows a circuit comprising a series combination of a positive capacitor 802 and a negative capacitor 801. The total capacitance of this combination can be calculated by the equation in 803 wherein the denominator labeled 804 is less than 1 is the condition labeled 805 is satisfied. Therefore, total capacitance $C_{total}$ is greater than the $C_{cap}$, which testifies to the fact that adding a negative capacitor in series with a positive one yields a higher total capacitance.

Figure 9:
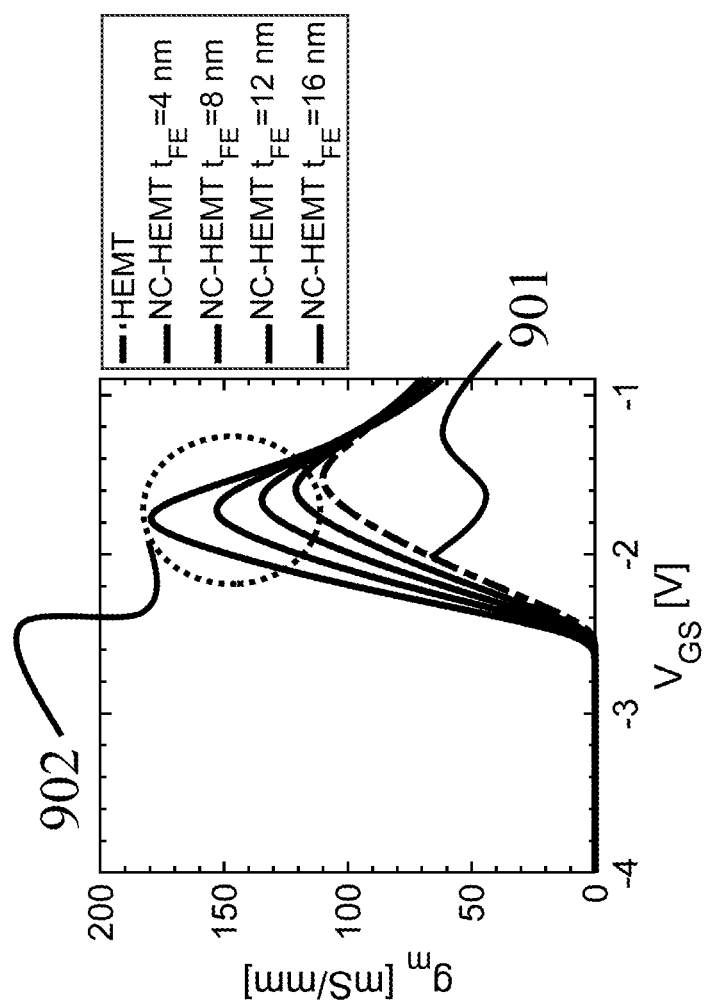
FIG. 9 shows a plot of transconductance vs gate voltage characteristics of the HEMT and the NC-HEMT of some embodiments.

FIG. 9 shows a plot of transconductance vs gate voltage ($g_m$ vs $V_{gs}$) characteristics 901 of the HEMT 600 and characteristics 902 of the NC-HEMT 500 for a number of ferroelectric oxide thickness. The plot of FIG. 9 demonstrates that $g_m$ of NC-HEMT 500 is higher than the HEMT 600 for a given gate voltage. Here, both the HEMTs has the same corresponding device dimensions. Transconductance of a transistor is proportional to the gate capacitance, this explains why NC-HEMT provides higher $g_m$ compared to the HEMT. Another thing is that a thicker FEO yields higher $g_m$ for a given gate voltage.

Figure 10:
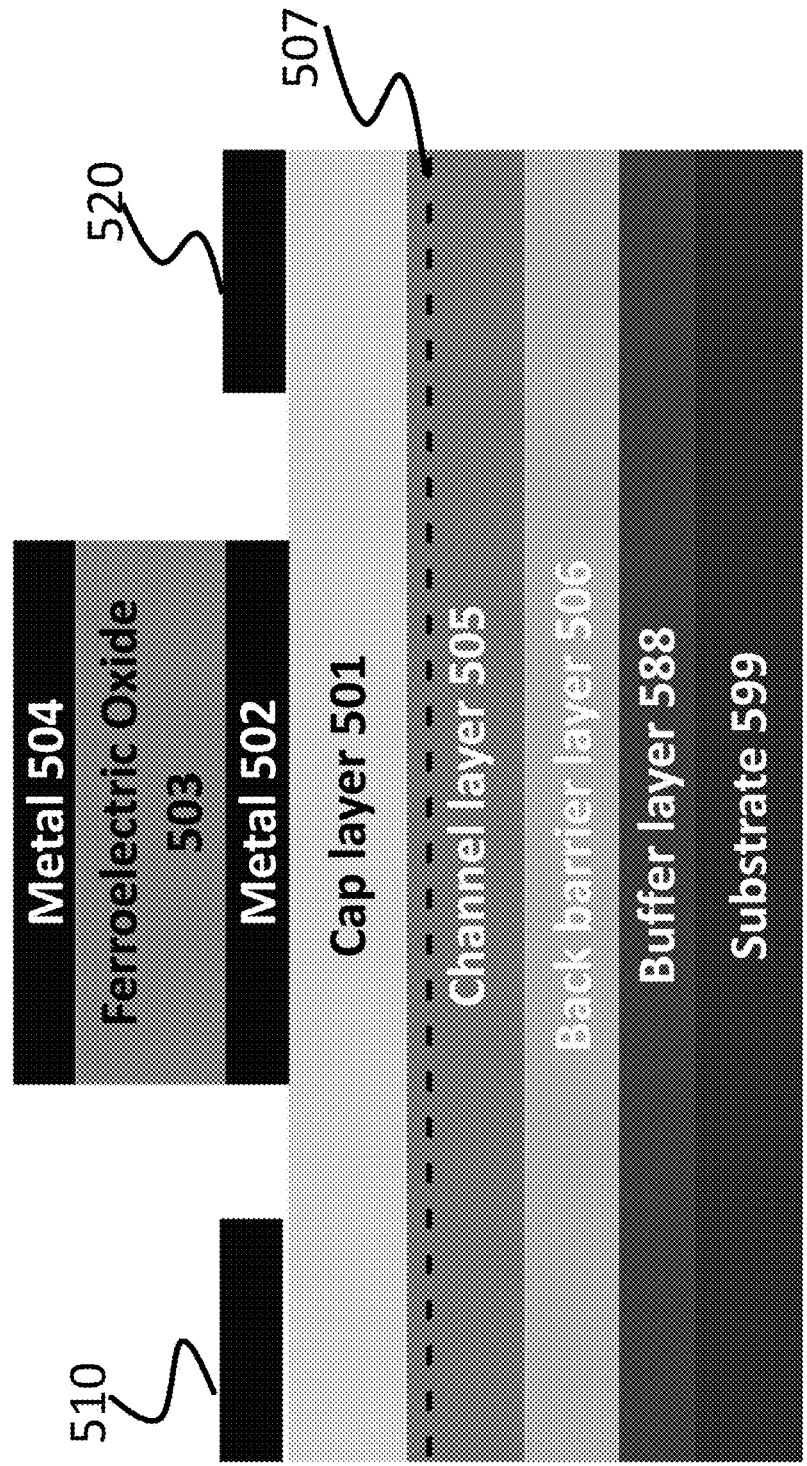
FIG. 10 shows a 2-D cross section view of a variant of NC-HEMT according to one embodiment.

FIG. 10 shows a 2-D cross section view of a variant of NC-HEMT according to one embodiment of the invention, wherein the structure includes a back barrier layer 506 between the channel layer and buffer layer. The purpose of a back barrier layer is to provide quantum confinement to the 2-DEG formed at the interface of channel and cap layer. According to one embodiment the back barrier is doped with p-type dopants.

Figure 11:
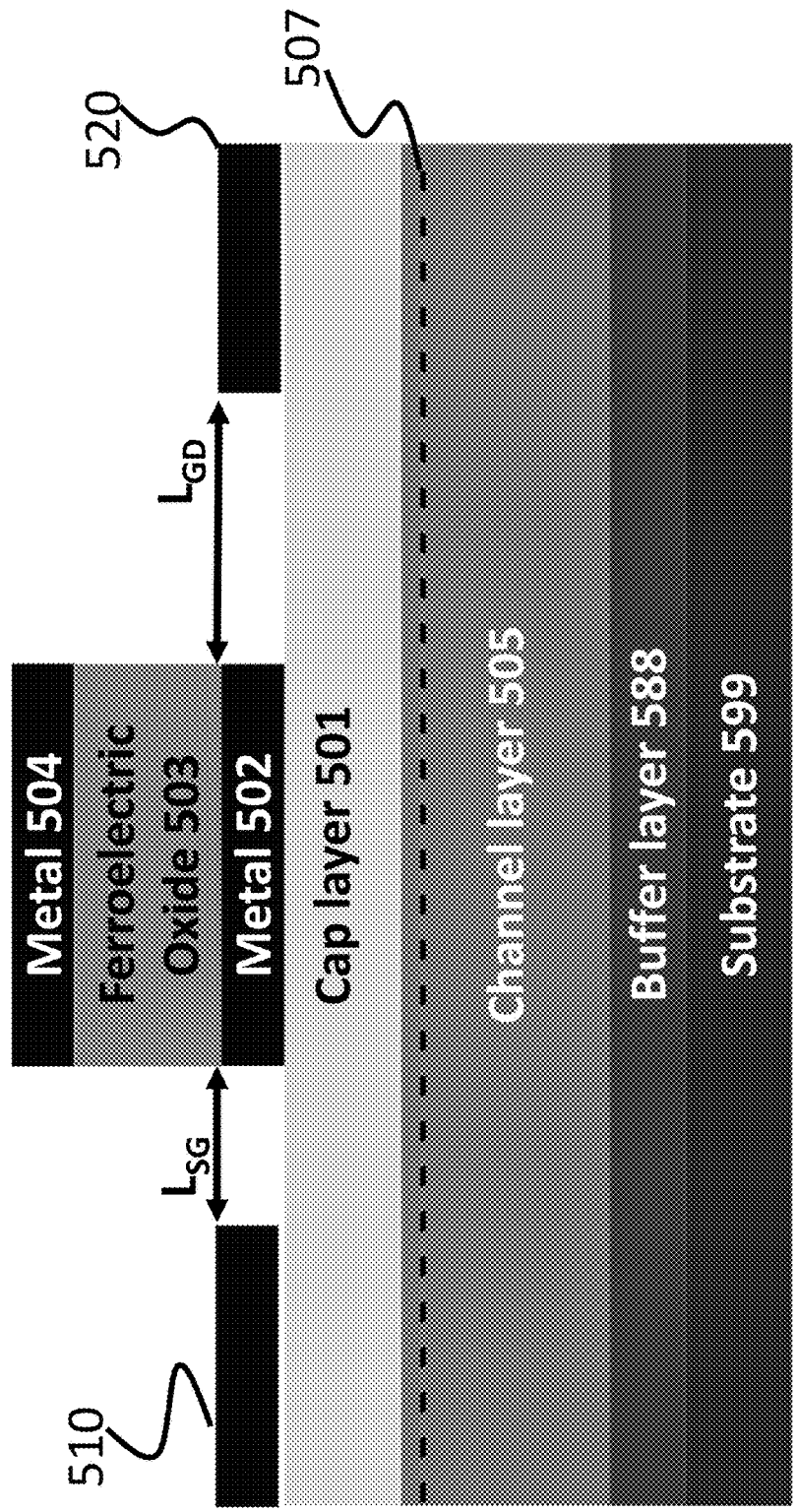
FIG. 11 shows the relative arrangement of source electrode, gate electrode, and drain electrode of a NC-HEMT according to one embodiment.

FIG. 11 shows the relative arrangement of source electrode, gate electrode, and drain electrode of a NC-HEMT according to one embodiment. In this embodiment, the distance between the source electrode and the gate electrode $L_{SD}$ is higher than the distance between the gate electrode and the drain electrode, $L_{GD}$. $L_{SD}$ should be as low as possible because high $L_{SD}$ increases source resistance which in turn decreases the linearity of the device, but cannot be made very small as it increases the parasitic capacitances which decreases cut off frequency.

In some embodiments, $L_{SD}$ is smaller than 500 nm. $L_{GD}$ depends on the break down voltage of the device. Higher break down voltage needs higher $L_{GD}$. $L_{GD}$ also depends on the material property of the semiconductor that would be used to form the channel, a wide band gap material would give higher breakdown voltage at a relatively lower $L_{GD}$. For example if the breakdown voltage of the device is $V_{BR}$ then a GaN based device $$L_{GD} = \frac{V_{BR}}{100 \text{ V}} \mu m.$$

The break-down voltage of any RF transistor has a direct relation with the maximum RF output power, $$P_{OUT} \sim \frac{1}{8} I_{DS.max}(V_{BR} - V_{knee})^2.$$

Therefore, a high breakdown voltage gives higher output power.

The NC-HEMT of FIG. 11 is adapted for radio-frequency (RF) applications. For RF applications, subthreshold swing (SS) which enables sharp switching of a transistor is less important, because the sharp switching is used to reduce the power dissipated in a micro-processor, which typically is not a problem for the RF applications. However, transconductance is an important factor for the RF applications as the gain and frequency response of the RF HEMT depends on the value of this parameter. The higher value of that transconductance causes the higher value of the gain.

Figure 12:
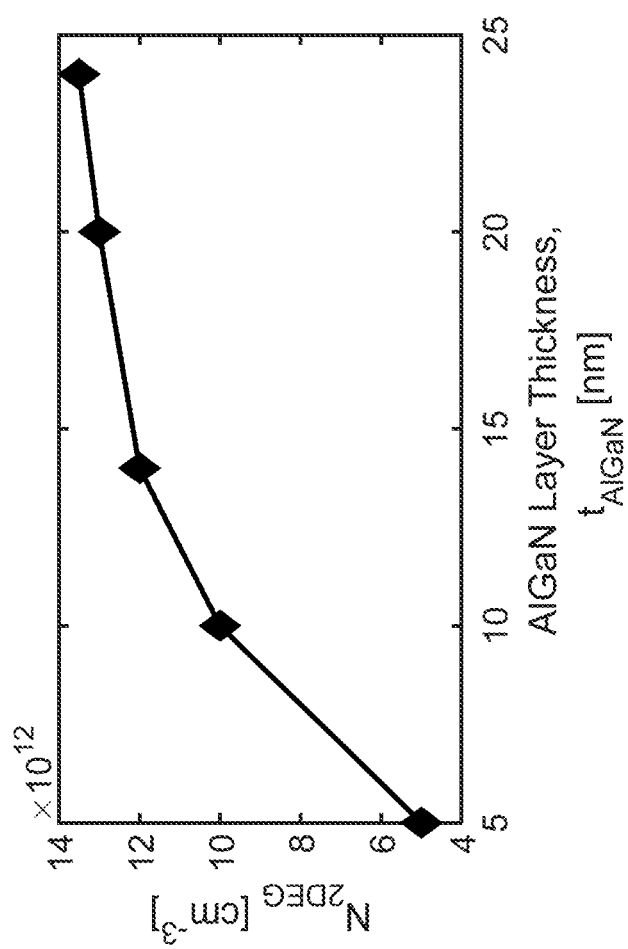
FIG. 12 shows a plot of 2-DEG concentration as a function of the thickness in the NC-HEMT of some embodiments.

FIG. 12 shows a plot of 2-DEG concentration as a function of the thickness of a cap layer wherein the cap layer is formed by AlGaN in the NC-HEMT of some embodiments. It is evident from the plot of FIG. 12 that a thicker cap layer gives higher 2-DEG concentration. 2-DEG concentration is an important parameter for achieving higher power at the output. Therefore, it is desirable to have thicker cap layer so that higher output power is achieved. The thicker cap layer reduces the cutoff frequencies because of reduced gate capacitance. However, NC-HEMT allows to increase the cap layer thickness without reducing the gate capacitance by introducing negative capacitance at the gate stack. As mentioned earlier negative capacitance increases the overall capacitance thus compensates for the capacitance that was lost due to thicker cap layer thickness.

Figure 13:
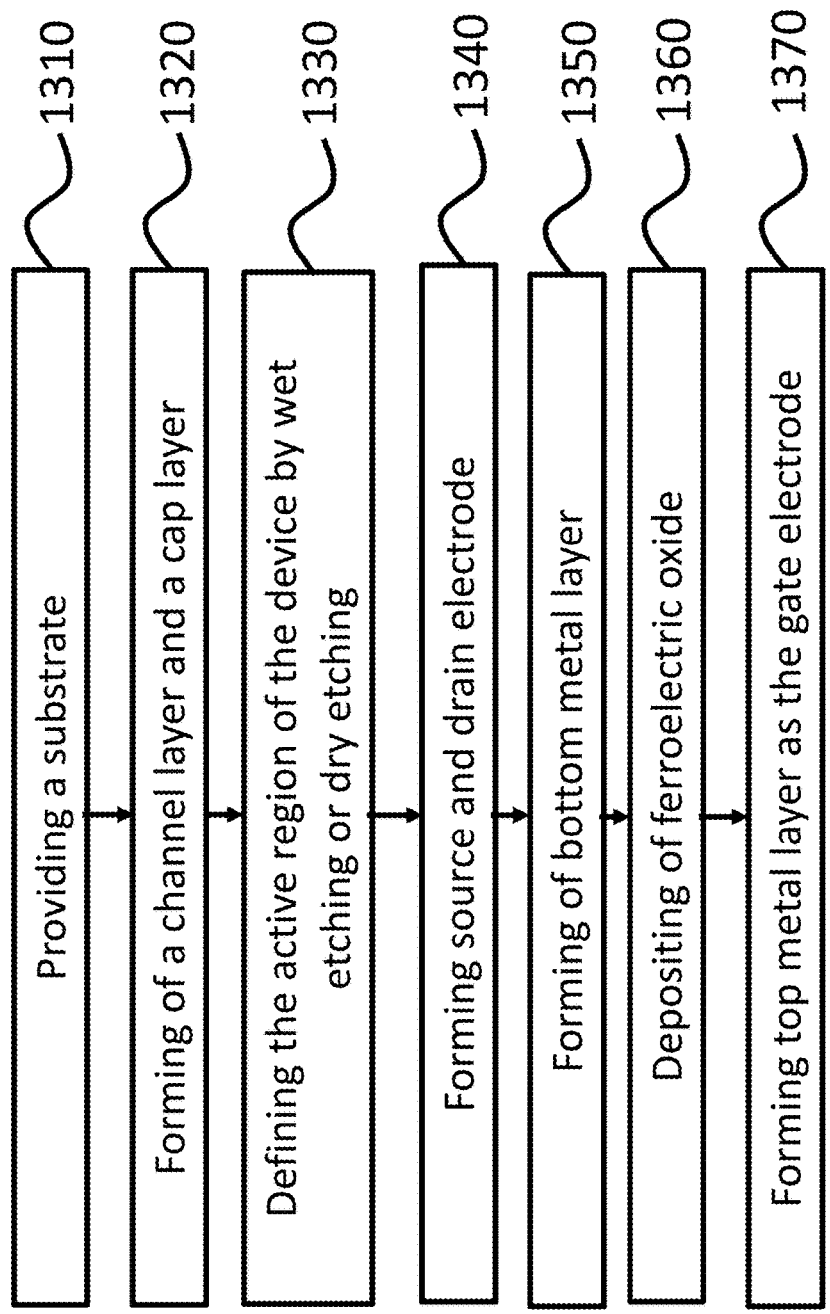
FIG. 13 shows the block diagram of a method for fabricating HEMT according to some embodiments.

FIG. 13 shows the block diagram of a method for fabricating HEMT according to some embodiments. The method includes providing substrate 1310, making 1320 a semiconductor structure comprising at least a III-N channel layer forming a carrier channel in the semiconductor structure. The material of cap-layer has a higher bandgap than the bandgap of material in the III-N channel layer. According to some embodiments, various methods can be adopted for the growth and formation of the cap-layer or channel layer, including but not limited to a Chemical Vapor Deposition (CVD), a Metal-Organic-Chemical-Vapor-Deposition (MOCVD), a Molecular Beam Epitaxy (MBE), a Metal-Organic Vapor Phase Epitaxy (MOVPE) and a Plasma Enhanced Chemical Vapor Deposition (PECVD) and a microwave plasma deposition system.

Defining the active region of the transistor by wet etching or dry etching 1330. Further the method also includes 1340, formation of source and the drain electrode to electrically connect to the carrier channel using one or combination of an ebeam deposition, a joule evaporation, a chemical vapor deposition and a sputtering process. Then the sample is annealed >800° C. in vacuum or N2 environment to form the ohmic contact.

Further method also includes 1350, the formation of the metal layer for the gate electrode. The formation of this metal layer can be done using Lithography→Metal Deposition→Lift-off and/or Metal deposition→Lithography→Etching approach. Here the lithography could be performed using, including but not limited to photo-lithography, electron-beam lithography. Metal deposition can be done using one or combination of an ebeam deposition, a joule evaporation, a chemical vapor deposition and a sputtering process.

After the formation of the metal layer deposit ferroelectric, 1360 oxide using one or combination of an atomic layer deposition (ALD), a chemical vapor deposition (CVD), Metal-Organic Chemical Vapor Deposition (MOCVD), a Molecular Beam Epitaxy (MBE), a Metal Organic Vapor Phase Epitaxy (MOVPE), a Plasma Enhanced Chemical Vapor Deposition (PECVD), and a microwave plasma deposition. Formation of the top metal layer 1370 can be performed in a manner similar to formation of the bottom metal layer 1340.

Although the invention has been described by way of examples of preferred embodiments, it is to be understood that various other adaptations and modifications can be made within the spirit and scope of the invention. Therefore, it is the objective of the appended claims to cover all such variations and modifications as come within the true spirit and scope of the invention.

We claim:

1. A high electron mobility transistor (HEMT), comprising:
   a semiconductor structure including a channel layer and a cap layer arranged on the channel layer to form a two dimensional electron gas (2-DEG) channel at an interface of the channel layer and the cap layer, wherein the cap layer includes III-N material;
   a set of electrodes including a source and a drain arranged on the cap layer with electrical connection to the 2-DEG channel; and
   a gate arranged on the cap layer between the source and the drain, such that the conductivity of the 2-DEG channel is modulated in response to applying voltage to the gate, the gate having a layered structure including a bottom metal layer arranged on top of the cap layer, a ferroelectric oxide (FEO) layer arranged on top of the bottom metal layer, and a top metal layer arranged on top of the FEO layer, wherein the thickness of the FEO layer is less than $t_{cap}/(2\alpha\varepsilon_{cap})$, wherein $\alpha$ is a parameter of material of the FEO layer, $t_{cap}$ is the thickness of the cap layer and $\varepsilon_{cap}$ is the electric permittivity of the cap layer.

2. The HEMT of claim 1, wherein the FEO layer includes one or combination of Barium titanate ($BaTiO_3$), Strontium titanate ($SrTiO_3$), Hafnium Zirconium Oxide (HfZrOx) and Doped Hafnium oxide.

3. The HEMT of claim 1, wherein the III-N material of the cap layer includes one or combination of aluminum gallium nitride (AlGaN), indium gallium nitride (InGaN), aluminum nitride (AlN), gallium nitride (GaN), indium aluminum nitride (InAlN), and indium aluminum gallium nitride (InAlGaN).

4. The HEMT of claim 1, wherein the thickness of the cap layer is between 2 nm to 250 nm, and wherein the thickness of the channel layer is between 5 nm to 3 µm.

5. The HEMT of claim 1, wherein the semiconductor structure includes a substrate layer providing mechanical support to the HEMT, wherein the substrate layer includes one or a combination of silicon (Si), silicon carbide (SiC), sapphire and gallium nitride (GaN).

6. The HEMT of claim 5, wherein the semiconductor structure includes a buffer layer arranged on the substrate layer, and wherein the channel layer is arranged on top of the buffer layer.

7. The HEMT of claim 5, wherein the semiconductor structure includes a buffer layer arranged on the substrate layer, and a back barrier layer arranged on the buffer layer, and wherein the channel layer is arranged on top of the back barrier layer.

8. The HEMT of claim 7, wherein the back barrier layer is doped with impurities that have conductivity types opposite to a conductivity type of the channel layer.

9. The HEMT of claim 8, wherein the semiconductor structure includes aluminum indium gallium nitride $Al_x In_y Ga_{1-x-y}N$, wherein $0 \leq x, y \leq 1$.

10. The HEMT of claim 1, wherein geometrical arrangements of the source, the drain, and the gate are selected for amplifying radio frequency (RF) signals.

11. The HEMT of claim 1, wherein a distance between the source and the gate is greater than a distance between the gate and the drain.

12. The HEMT of claim 1, wherein a band gap of the cap layer is higher that a band gap of the channel layer.

13. The HEMT of claim 1, wherein the FEO layer operates as a negative capacitor when an electrical pulse is applied to the gate.

14. The HEMT of claim 13, wherein the wherein the thickness of the cap layer of the semiconductor structure is greater than a maximum thickness allowed for the cut-off frequency of the HEMT without consideration for the negative capacitor.

15. The HEMT of claim 14, wherein the thickness of the cap layer is greater than a ratio of a structure dependent constant to the cut-off frequency of the HEMT minus the length of the HEMT, wherein the structure dependent constant is 3.9 GHz-μm for the cap layer including aluminum gallium nitride (AlGaN) material.

16. A method for manufacturing a high electron mobility transistor (HEMT), comprising:
   providing a substrate and a semiconductor structure including a channel layer and a cap layer arranged on the channel layer to form a two dimensional electron gas (2-DEG) channel at an interface of the channel layer and the cap layer, wherein the cap layer includes III-N material;
   etching the semiconductor structure to define an active region of the HEMT;
   forming a set of electrodes including a source and a drain arranged on the cap layer with electrical connection to the 2-DEG channel by metal deposition and annealing; and
   forming a gate by depositing a bottom metal layer on the cap layer between the source and the drain, depositing a Ferroelectric Oxide (FEO) layer on the bottom metal layer, and depositing a top metal layer on the FEO layer, wherein the thickness of the FEO layer is less than $t_{cap}/(2\alpha t\varepsilon_{cap})$, wherein $\alpha$ is a parameter of material of the FEO layer, $t_{cap}$ is the thickness of the cap layer, and $\varepsilon_{cap}$ is the electric permittivity of the cap layer.

17. The method of claim 16, wherein the electrodes are formed using one or combination for an electron beam physical vapor deposition (EBPVD), a joule evaporation, a chemical vapor deposition, and a sputtering process.

18. The method of claim 16, wherein the semiconductor structures are made using one or combination of a chemical vapor deposition (CVD), Metal-Organic Chemical Vapor Deposition (MOCVD), a Molecular Beam Epitaxy (MBE), a Metal Organic Vapor Phase Epitaxy (MOVPE), a Plasma Enhanced Chemical Vapor Deposition (PECVD), and a microwave plasma deposition.

19. The method of claim 16, further comprising:
   forming a back barrier layer beneath the channel layer.

20. The method of claim 16, wherein the ferroelectric oxide layer is deposited using one or combination of an atomic layer deposition (ALD), a chemical vapor deposition (CVD), Metal-Organic Chemical Vapor Deposition (MOCVD), a Molecular Beam Epitaxy (MBE), a Metal Organic Vapor Phase Epitaxy (MOVPE), a Plasma Enhanced Chemical Vapor Deposition (PECVD), and a microwave plasma deposition.

* * * * *